(12) United States Patent  (10) Patent No.: US 7,474,112 B2
Wills  (45) Date of Patent: Jan. 6, 2009

(54) METHOD AND APPARATUS FOR NON-INVASIVELY TESTING INTEGRATED CIRCUITS

(75) Inventor: Kendall Scott Wills, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/279,655

(22) Filed: Apr. 13, 2006

(65) Prior Publication Data

US 2006/0181296 A1 Aug. 17, 2006

Related U.S. Application Data

(62) Division of application No. 10/737,650, filed on Dec. 16, 2003, now Pat. No. 7,057,409.

(51) Int. Cl.
*G01R 31/02* (2006.01)
(52) U.S. Cl. ...................................................... 324/763
(58) Field of Classification Search ........................ None
See application file for complete search history.

(56) References Cited

U.S. PATENT DOCUMENTS

| 5,130,645 | A | 7/1992 | Levy |
| 5,248,936 | A | 9/1993 | Nakata et al. |
| 5,270,655 | A | 12/1993 | Tomita |
| 5,355,081 | A | 10/1994 | Nakata et al. |
| 5,570,035 | A | 10/1996 | Dukes et al. |
| 6,323,639 | B1 | 11/2001 | Park |
| 6,483,327 | B1 * | 11/2002 | Bruce et al. ................. 324/752 |
| 6,815,973 | B1 | 11/2004 | Conn |
| 7,057,409 | B2 * | 6/2006 | Wills ........................... 324/763 |
| 2006/0181297 | A1 * | 8/2006 | Wills ........................... 324/763 |

* cited by examiner

*Primary Examiner*—Jermele M Hollington
(74) *Attorney, Agent, or Firm*—Yingsheng Tung; Wade James Brady, III; Frederick J. Telecky, Jr.

(57) ABSTRACT

The preferred embodiments of the present invention provide non-invasive approaches of testing ICs that use photon emission from semiconductor devices to provide results of various testing procedures. For example, instead of reading the results from the built-in-self-test (BIST) circuitry using micro-mechanical probes, the results from BIST may be represented using an array of circuit elements configured to emit photons. Accordingly, by reading the photon emission of this BIST circuitry, the results of the testing procedures may be measured non-invasively. In addition, the preferred embodiments also may use an external light source to initiate on-chip testing functions so that the number of external connections to the IC may be further minimized. For example, instead of providing input signals to BIST circuitry using micro-mechanical probes, pulsed lasers may provide desired input signals.

5 Claims, 3 Drawing Sheets

METHOD AND APPARATUS FOR NON-INVASIVELY TESTING INTEGRATED CIRCUITS

CROSS-REFERENCE TO RELATED APPLICATIONS

This is a divisional application of application Ser. No. 10/737,650 filed Dec. 16, 2003, now U.S. Pat. No. 7,057,409, the contents of which are herein incorporated by reference in its entirety.

BACKGROUND OF THE INVENTION

1. Technical Field of the Invention

The present invention relates generally to testing integrated circuits and more particularly to allowing various points within an integrated circuit to be tested non-invasively irrespective of whether or not the integrated circuit is packaged.

2. Background Information

The ubiquitous presence of integrated circuits (ICs) in almost every electronic device is testament to their importance in today's society. ICs are generally manufactured in wafer form, where multiple ICs are manufactured in an array using photolithography techniques. FIG. 1 illustrates an exemplary wafer 20 having a frontside 20A and a backside 20B, where arrays of ICs are manufactured on the frontside 20A. Separating the ICs from each other may be accomplished by dicing the wafer along the orthogonal scribe lines. The ICs may be tested at various stages in the manufacturing process. For example, the ICs may be tested while they are in wafer form. Alternatively, the ICs may be tested after they are separated from each other but prior to being completely packaged. Also, the ICs may be tested after they have been packaged by accessing the various pins of the package.

One method of testing ICs consists of mechanical probing the completed IC on the wafer. Mechanical probing is accomplished by placing fine needles onto pads designed into the IC for this purpose. Due to performance constraints of the mechanical probing system several problems occur that limit detection of defective ICs. The first problem is with touching the pads. Repeated contact of the needles with the pads causes cracking of the materials that form the pad structure. The second problem is with the inductance of the mechanical probing system, which can be several orders of magnitude higher than other inductances of the IC. This high inductance limits the speed at which the IC can be tested.

Another method of testing the ICs includes micro-mechanical probing. Micro-mechanical probing is generally accomplished by using fine tipped mechanical probes to make physical contact with various points on the surface of the IC. Probing ICs in this manner can be problematic for several reasons. For example, IC technology trends indicate that the dimensions of ICs decrease with time, which results in smaller and smaller devices on the IC. Consequently, it can be difficult to locate a desired device on the IC using a micromechanical probe. Also, since the probe needles tend to be very small (on the order of 1 µm or smaller) they may be easily bent. In addition, when large volumes of ICs are being tested in this manner, physically attaching and detaching the micromechanical probes to each IC may consume too much time. Furthermore, if the IC has been packaged, portions of the package may need to be removed to gain access, and if the is IC is packaged in a "flip-chip" package, physical access to desired points on the IC via micro-mechanical probes may not be possible.

Yet another testing method is to test in the IC after final packaging. In this case the packaged IC is connected to the test apparatus through the connections of the package. At speed testing is generally not an issue in this test methodology as the connections emulate the actual operation of the IC in the customer application. In the case of testing packaged IC the cost of testing is one of the most important issues. This cost-effective technique that can permit at speed testing is desirable.

Recent testing trends involving optical techniques have proven useful in post mortem analysis of defective ICs—i.e., failure analysis tests. One optical technique involves exposing an IC to a light source that may be in the infrared or visible wavelength region in order to perturb the state of individual circuit elements. Perturbing individual circuit elements on the IC in this manner allows defective circuit elements on the defective IC to be determined. For example, if it is believed that an individual transistor is defective, the state of this transistor may be perturbed by light to turn the transistor on and off. While the transistor is being turned on and off by the light source, the current in the transistor may be measured to ensure that the transistor consumes a predetermined amount of current while the transistor is on, and likewise consumes a negligible amount of current when the transistor is off. If the transistor does not consume the expected amount of current in either case it may be deemed defective and the root defect of the defective IC may be determined.

Another optical technique called Picosecond imaging circuit analysis (PICA) was recently developed by IBM and is described in "Picosecond imaging circuit analysis," *IBM J Res. Develop.*, Vol. 44, No. 4, July 2000. PICA techniques rely on a combination of physical phenomena that are present in modern digital circuits. Modern digital circuits include metal-oxide semiconductor transistors (MOSFETs), which typically operate in the saturation region of their current-voltage curves when "ON". While in the saturation region, very high electric fields exist in the channel. Charge carriers (i.e., electrons and holes) can quickly gain a significant amount of kinetic energy in such electric fields, and indeed, many "hot" carriers are generated in this manner when current flows through the channel. A variety of scattering and recombination mechanisms may strip the energy from "hot" carriers, and in so doing, may trigger the emission of a photon of light. The light is emitted over a wide range of frequencies, but the infrared band of the spectrum is particularly significant because silicon is relatively transparent there. As a result, transistors that carry current emit infrared light, and optical images of an IC may be made based on this light emission. Further, multiple optical images may be taken while an IC is operating, and when looking at the images consecutively with respect to time, a "movie" may be generated indicating which circuit elements are on at which times.

The PICA method may be used to root out defective circuit elements. For example, if a metal interconnect on an IC is blown causing a transistor to continually be in the saturation mode, then this transistor will emit light and will be more prominent in the PICA images. Consequently, failure analysis engineers may consult circuit schematics and perform additional testing to determine that the metal interconnect is the root cause of the problem. This example illustrates a downfall of the PICA method and other similar methods; that is, PICA simply conveys a "problem" spot on the IC, where this "problem" spot may be the result of the actual defect. Additionally, non-manufacturing IC defects may be difficult to detect using PICA. For example, if a critical circuit block such as an arithmetic logic unit (ALU) is not performing mathematical operations correctly due to a programming error, then PICA methods may be less effective because the error may not manifest itself as a transistor conducting current and therefore may be more difficult to notice on a PICA image. Accordingly, methods and apparatuses are needed that allow more sophisticated non-invasive testing of ICs to be accomplished.

BRIEF SUMMARY

A method and apparatus for non-invasively testing ICs is disclosed. In some embodiments the apparatus comprises, a photo detector; a processing circuit coupled to the photo detector; a power source coupled to the IC; and a lens disposed between the IC and the detector, where the IC includes a photo emission array coupled to a BIST circuit, and where the photo emission array emits light based upon the results of a test performed by the BIST circuit.

In one embodiment, the IC further comprises a photo detecting mechanism coupled to the BIST circuit, where the photo detecting mechanism conveys at least one input signal to the BIST circuit and where the photo detecting mechanism receives the input signal from an external light source.

NOTATION AND NOMENCLATURE

Certain terms are used throughout the following description and claims to refer to particular system components. As one skilled in the art will appreciate, semiconductor companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

The term "IC" refers to an integrated circuit fabricated upon a semiconductor wafer. The "frontside" of the IC refers to the side of the IC that includes electrical devices that have been processed onto its surface through a series of fabrication steps. The "backside" of the IC refers to the side opposite the frontside and generally does not contain electrical devices. Thus, a frontside analysis technique is an analysis performed using the side of the IC that has been processed and now contains electrical devices, whereas a backside analysis technique uses the side of the IC that has not been processed to contain devices (also known as substrate side). The term "flip-chip" refers to a method of packaging ICs such that the frontside of the IC faces downward toward the point of electrical connection and the backside faces upward when placed into the package.

BRIEF DESCRIPTION OF THE DRAWINGS

For a more detailed description of the preferred embodiments of the present invention, reference will now be made to the accompanying drawings, wherein like components are indicated using like reference numbers.

DETAILED DESCRIPTION OF THE PREFERRED EMBODIMENTS

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to suggest that the scope of the disclosure, including the claims, is limited to that embodiment.

The preferred embodiments of the present invention provide non-invasive approaches of testing ICs that use photon emission from semiconductor devices to provide results of various testing procedures. For example, instead of reading the results from the built-in-self-test (BIST) circuitry using micro-mechanical probes, the results from BIST may be represented using an array of circuit elements configured to emit photons. Accordingly, by reading the photon emission of this BIST circuitry, the results of the testing procedures may be measured non-invasively. In addition, the preferred embodiments also may use an external light source to initiate on-chip testing functions so that the number of external connections to the IC may be further minimized. For example, instead of providing input signals to BIST circuitry using micro-mechanical probes, pulsed lasers may provide desired input signals.

Figure 2:
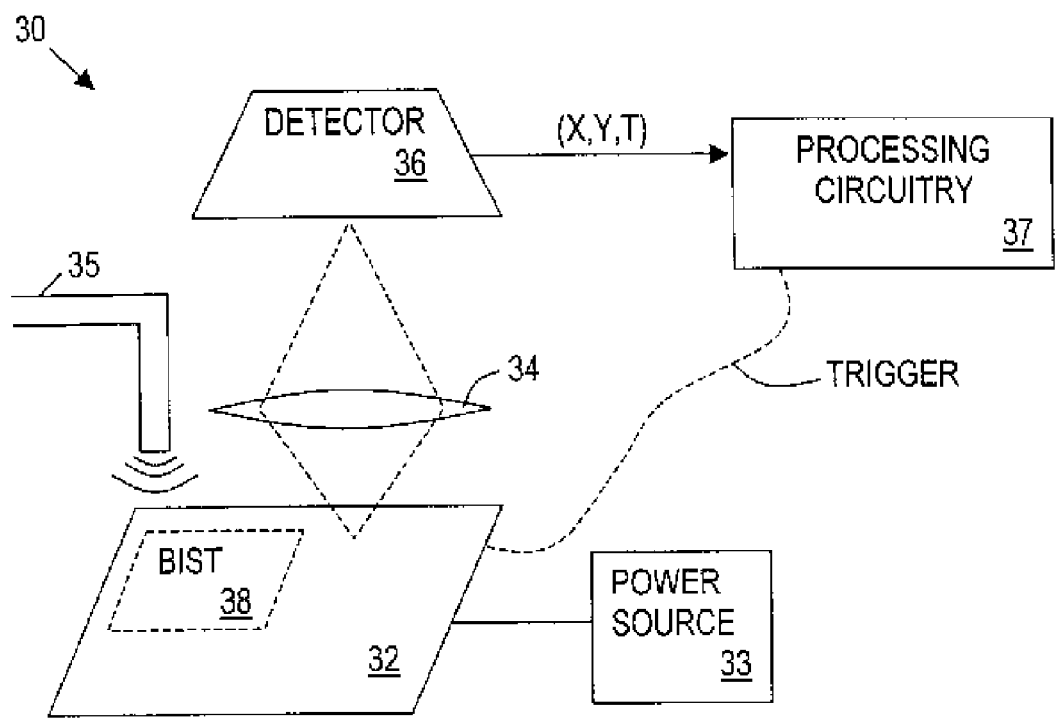
FIG. 2 illustrates an exemplary system for testing an IC.

FIG. 2 illustrates an exemplary system 30 for performing analysis according to the preferred embodiments. System 30 is capable of producing simultaneous spatial and temporal resolution of optical images taken from an IC 32. Note that IC 32 may include multiple ICs in a wafer form that are being tested simultaneously. A power source 33 is coupled to the IC 32 to provide power to the various circuit elements contained thereon. As circuit elements on IC 32 change states, they may conduct transient current pulses and may emit light as described above. A lens 34 is preferably disposed between the IC 32 and a photodetector 36. Lens 34 may focus light emissions from the IC 32 and provide the focused emissions to the photodetector 36. System 30 also includes a focused light source 35 capable of providing predetermined continuous and pulsed light of a desired wavelength, typically 1.064 um for backside work, to the IC 32 as will be described below. Photodetector 36 may comprise a charge coupled device (CCD) or alternatively a microchannel plate photomultiplier. Regardless of the method of implementing photodetector 36, photodetector 36 preferably provides an X signal indicating the row, a Y signal indicating the column in which the photon is detected, and a T signal indicating the time when the photon is detected (within picosecond-scale resolution.) The physical location of devices on the IC 32 also may be used to reduce the time associated with detecting and collecting photon emissions. The X, Y, and T signals (which may or may not be in digital form), coming from the photodetector 36 are preferably provided to processing circuitry 37 for image analysis.

In addition to receiving the X, Y, and T signals from the photodetector 36, processing circuitry 37 also receives a trigger signal from the IC 32. The trigger signal is a reference signal, and typically it is correlated with the switching event(s) being measured on IC 32. Processing circuitry 37 measures the T signal relative to the trigger signal. If the signals are digital, the processing circuitry 37 calculates a difference between the T signal and the trigger signal. If the signals are not digital, the processing circuitry 37 determines the photon detection time by measuring an interval between a transition of the trigger signal and a transition of the T signal. In some embodiments, time resolved data is not desirable and the T signals are discarded such that only spatial information is processed.

IC 32 may produce transient current pulses (and consequently light emissions), upon being stimulated by a built-in-self-test (BIST) circuit 38 integrated on the IC 32. In general, BIST involves integrating additional circuitry on IC 32 to test specific functions of the IC 32. The BIST circuitry 38 may generate various test patterns to test different portions of the IC 32. For example, the BIST circuit 38 may generate test patterns to test a memory (not shown in FIG. 2.) Additionally, BIST circuitry 38 may also provide the trigger signal to processing circuitry 37 mentioned above.

Figure 3:
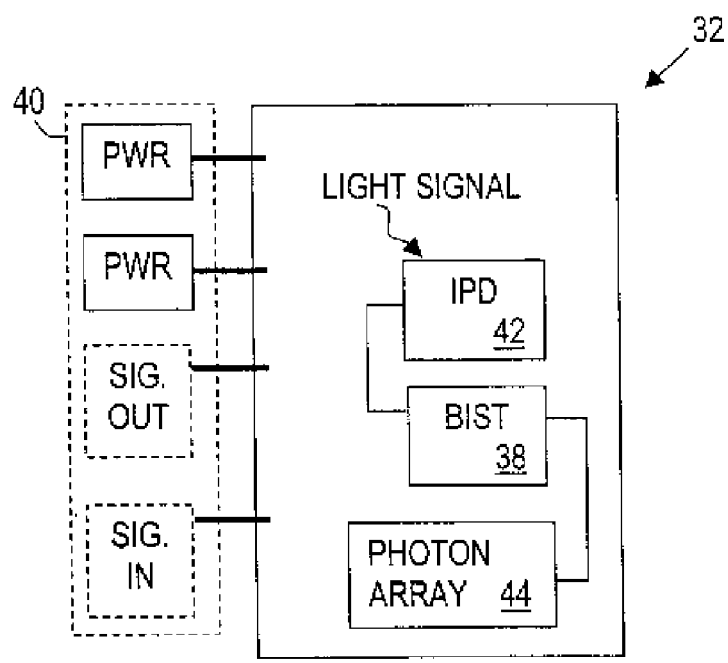
FIG. 3 depicts an illustrative integrated circuit.

FIG. 3 depicts one embodiment of IC 32 including BIST circuitry 38. Note that the location of the BIST circuitry 38 with respect to other circuits of IC 32 is arbitrary such that BIST circuitry 38 may be located anywhere within IC 32. As illustrated, IC 32 may be coupled to numerous bonding pads 40. Bonding pads 40 may include pads for delivering power to the IC 32, optional pads for providing signals to IC 32, and optional pads for receiving signals from IC 32. In this manner, signal and power information may be provided to IC 32 via bonding pads 40 through micro mechanical probes as described above. IC 32 may further include an integrated photodetector (IPD) 42 to allow more non-invasive methods of conveying signal information to IC 32. IPD 42 is coupled to BIST circuitry 38 and preferably receives light from the light source 35 (shown in FIG. 2.) The light coming from light source 35 may convey various types of information. For example, light source 35 may provide necessary timing signals for BIST circuitry 38. In this manner, the signal information going to IC 32 may be conveyed using light source 35, and the number of micro mechanical probes used in testing IC 32 may be limited.

Figure 1:
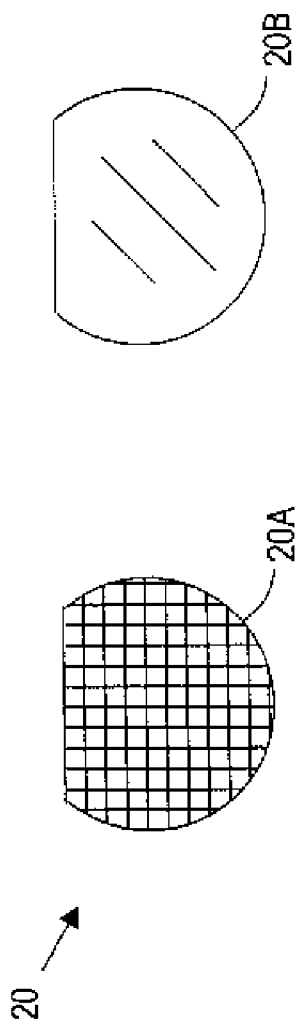
FIG. 1 depicts a semiconductor wafer.
Figure 4:
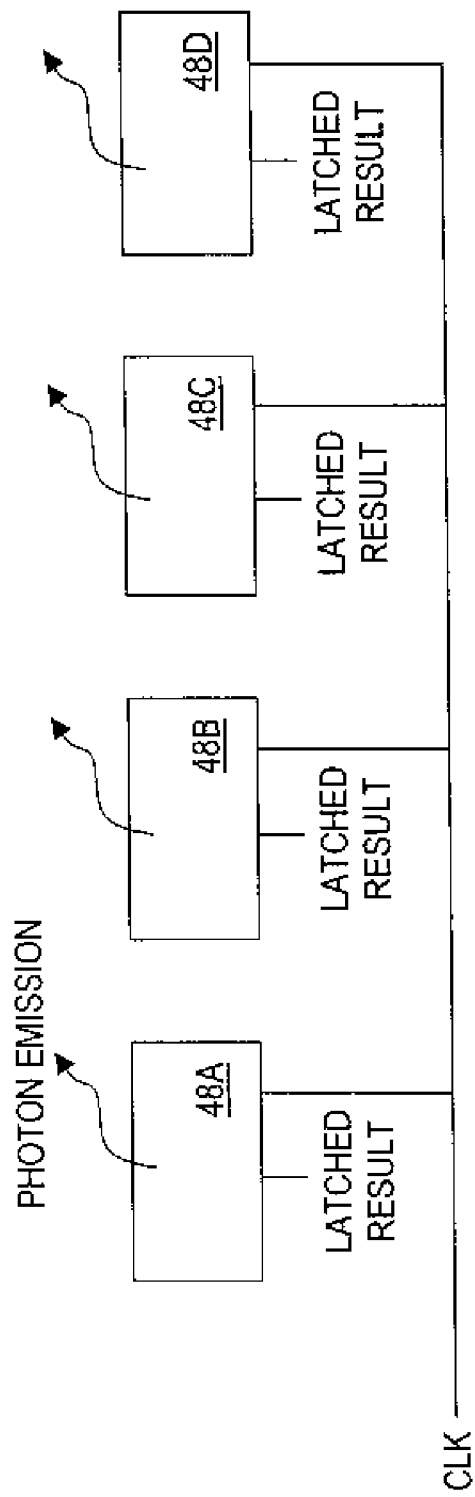
FIG. 4 represents a possible photon array.

Referring again to FIG. 3, IC 32 may further include a photo emission array (PEA) 44 coupled to BIST circuitry 38. PEA 44 may be used to convey signal information regarding the results of the BIST. FIG. 4 illustrates an exemplary PEA comprising multiple photon emitting elements 48A-D that may be used to provide a binary-style output of the BIST results, such that element 48A may provide the most-significant-bit (MSB) and element 48D may provide the least-significant-bit (LSB). Note that although FIG. 4 shows four photon emitting elements, alternate embodiments are possible including greater or fewer photon emitting elements.

BIST circuitry 38 (not specifically shown in FIG. 4) preferably provides a clock signal CLK and also provides the results of the BIST in latched form. For example, when the BIST circuitry 38 completes a predetermined test, the results of the test may be stored in binary form in a set of latches (not specifically shown in the Figures), which may provide the results to each of the elements 48A-D. In addition, BIST circuitry 38 may provide a clock signal CLK to each element 48A-D. CLK is preferably used by each photon emitting element to toggle its conduction state on and off at a predetermined frequency and duty cycle. By toggling the photon emitting elements on and off in this manner, transient currents may be generated and the photon emitting elements may emit light. Consequently, system 30 (shown in FIG. 2) may detect the light given off by IC 32 and interpret the results. For example, if the latched results for elements 48A-D are 1001 respectively, then as CLK switches, elements 48A and 48D may generate light as they switch on an off. Conversely, despite the switching of CLK, elements 48B and 48C will not switch (and generate light) because of the result latched to their inputs is 00 in this example. Note that although elements 48A-D have been referred to as positive logic devices—i.e., a "1" enables and a "0" disables—they may be implemented with negative logic devices also. Also, by varying the frequency and duty cycle of CLK, the intensity of the light measured by the system 30 may be controlled.

Figure 5:
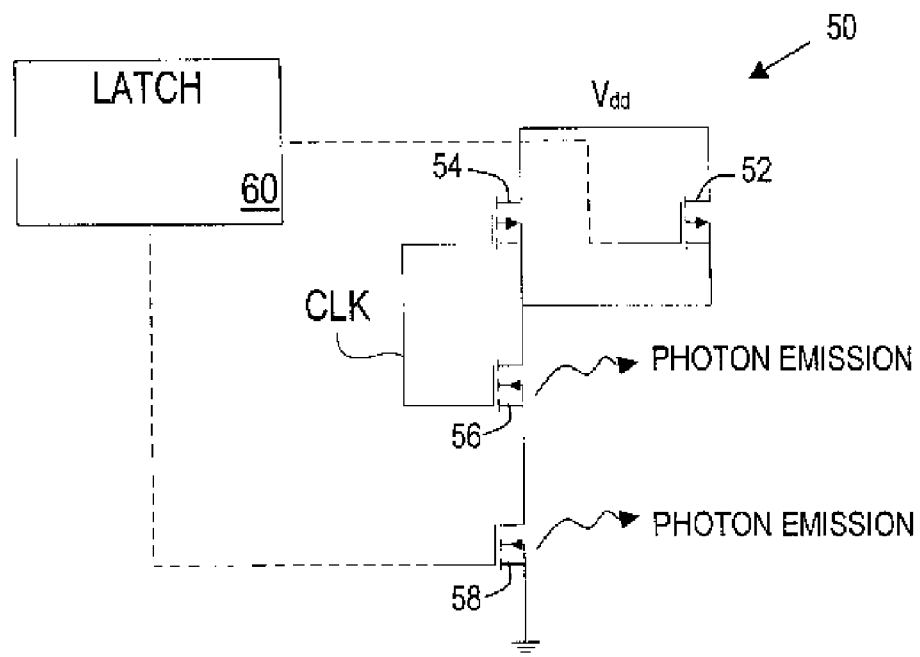
FIG. 5 illustrates an exemplary photon emitting element.

FIG. 5 depicts an exemplary positive logic photon emitting element 50 that may be used to implement the photon emitting elements 48A-D illustrated in FIG. 4. Element 50 comprises p-channel metal-oxide semiconductor transistors (PMOS) 52 and 54, and also comprises n-channel metal-oxide semiconductor transistors (NMOS) 56 and 58. Transistors 52 and 54 are parallel connected with their source terminals coupled to the power supply $V_{dd}$, and their drain terminals coupled to the drain terminal of NMOS transistor 56. The gate terminal of transistor 54 is coupled to CLK, and the gate of transistor 52 is coupled to a latch 60 that stores the results of the BIST. Transistor 56 has its source terminal coupled to the drain terminal of transistor 58 and transistor 58 has its source terminal coupled to ground. The gate terminal of transistor 56 is coupled to CLK, and the gate terminal of transistor 58 is coupled to the latch 60 that stores the results of the BIST. Note that transistors 54 and 56 form an inverter type arrangement.

With the results of the BIST coupled to the inputs of transistors 52 and 58, and transistors 54 and 56 coupled to CLK, photon emissions may occur as current flows from $V_{dd}$ to ground. Since the electron mobility of an NMOS transistor is greater than the hole mobility of a similarly sized PMOS transistor, NMOS transistors 56 and 58 will be the primary source of the photon emissions within element 50. For example, assume that the result from the latch 60 is high, or equal to $V_{dd}$. In this example, transistor 52 will be off because its gate-to-source voltage will be zero, and transistor 58 will be on because its gate-to-source voltage will be approximately $V_{dd}$. Accordingly, if transistor 56 turns on, then transistors 56 and 58 may conduct current and emit photons.

Current conduction in element 50 is related to the inverter arrangement of transistors 54 and 56. In general, current conduction (which will cause photon emission) occurs in inverters when both transistors are on. That is, when CLK is stagnant at $V_{dd}$, then transistor 56 is on, transistor 54 is off, and no current flows in element 50 while transistor 58 is off. Likewise, when CLK is stagnant at ground, then transistor 54 is on, transistor 56 is off, and no current flows in element 50. Current conduction is greatest (and photon emission is greatest), however, when both transistors 54 and 56 are in saturation at the same time. This occurs, for example, when CLK is equal to the threshold voltage of the inverter arrangement of transistors 54 and 56, which is usually half of $V_{dd}$. Also, the intensity of the light emitted by element 50 may increase as the frequency of CLK increases. Preferably, the circuit elements that emit photons (transistors 56 and 58 of element 50) will be separated from other circuit elements to avoid interference. For example, if transistors 56 and 58 are placed close to large current driving transistors on IC 32, then the large current driving transistors may have greater photon emissions than transistors 56 and 58, and as a result it may be difficult to determine if transistors 56 and 58 are actually emitting photons. In this manner, photon emission elements 48A-D illustrated in FIG. 4 may be separated from each other to reduce interference.

As mentioned above, element 50 may be implemented on IC 32, where IC 32 is fabricated using semiconductor processing techniques that include forming circuit elements on a semiconductor substrate and using various conductors and insulators to connect the circuit elements as desired. In some embodiments, the photon emitting transistors of element 50 (i.e., transistors 56 and 58) are left uncovered by conductors and insulators such that photon emissions are not obscured by the conductors or insulators.

Figure 6:
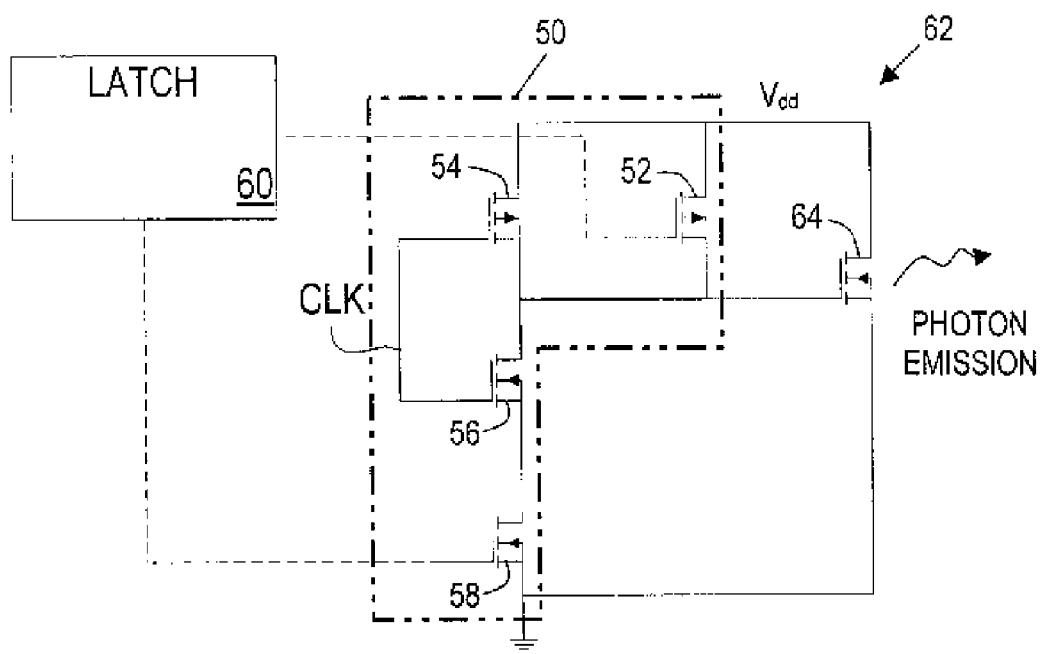
FIG. 6 depicts another exemplary photon emitting element.

FIG. 6 depicts another exemplary photon emitting element 62 comprising element 50 (shown in FIG. 5) and a transistor 64, where transistor 64 emits photons as indicated in FIG. 6. The drain of transistor 64 is coupled to $V_{dd}$, the source of transistor 64 is coupled to ground, and the gate of transistor 64 is coupled to the output of the inverter formed by transistors 54 and 56. Note that photon emission by transistor 64 is not contingent upon the presence of the CLK signal and in some embodiments, the CLK signal is excluded. Since NMOS transistors have greater photon emissions than similarly sized PMOS transistors, transistor 64 preferably is an NMOS transistor. In addition, transistor 64 may be separated from element 50 on IC 32 to prevent unwanted interference between photon emissions emanating from element 50 and the photon emissions of transistor 64. Also, in some embodiments, transistor 64 is left uncovered such that its photon emissions are not obscured by the conductors or insulators.

While the preferred embodiments of the present invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. For example, although CMOS devices were described above, the techniques described above may also apply to Bipolar technologies. Also, although PICA methods are referenced herein, alternate methods of capturing spatial images of the IC may be used. Accordingly, the scope of protection is not limited by the description set out above. Each and every claim is incorporated into the specification as an embodiment of the present invention.

What is claimed is:

1. A system for testing an IC chip, comprising:
   a first photo detector;
   a processing circuit coupled to the photo detector;
   the IC chip including:
      a BIST circuit;
      an photon emission array; and
      an integrated photodetector operable to trigger the BIST circuit; and
   a power source coupled to the IC; and
   a light source operable to convey a signal directed to the integrated photodetector for triggering the BIST circuit, wherein the photon emission array emits light directed to the first photo detector based upon the results of a test performed by the BIST circuit.

2. The system of claim 1, wherein the light emitted from the IC provides a representative signal to the processing circuit.

3. The system of claim 1, wherein the processing circuit interprets signals from the first photo detector and determines the results of the test performed by the BIST circuit.

4. The system of claim 3, wherein the photon emission array comprises multiple photon emitting elements having a most significant bit and a least significant bit such that the multiple photon emitting elements are capable of representing the results of the test performed by the BIST circuit in binary form.

5. The system of claim 1, wherein the first photo detector and the light source are on the same side of the IC chip where the integrated photodetector is formed.

* * * * *